United States Patent [19]

Lightfoot

[11] Patent Number: 5,319,525
[45] Date of Patent: Jun. 7, 1994

[54] CIRCUIT ASSEMBLY

[75] Inventor: David Lightfoot, Horsham, England

[73] Assignee: Nokia Mobile Phones (U.K.) Ltd., Surrey, United Kingdom

[21] Appl. No.: 880,176

[22] Filed: May 6, 1992

[30] Foreign Application Priority Data

May 10, 1991 [GB] United Kingdom ............... 9110116

[51] Int. Cl.⁵ .......................... H05K 7/02; H05K 5/00
[52] U.S. Cl. ................................. 361/760; 361/730; 361/736; 361/761; 361/809
[58] Field of Search ............ 361/392, 393, 394, 395, 361/397, 399, 400, 401, 402, 403, 404, 405, 406, 409, 412, 413, 417, 418, 419, 420; 174/255, 52.1, 52.5; 248/220.2, 220.3, 221.3

[56] References Cited

U.S. PATENT DOCUMENTS 4,610,083  9/1986  Campisi et al. ..................... 29/832
4,709,253 11/1987  Walters .............................. 361/400

FOREIGN PATENT DOCUMENTS 239222   7/1962  Australia .
0031240  7/1981  European Pat. Off. .
0040379 11/1981  European Pat. Off. .
0111734  6/1984  European Pat. Off. .
0234838  9/1987  European Pat. Off. .
734004   8/1952  United Kingdom .
1201284  7/1968  United Kingdom .
2198291  6/1988  United Kingdom .
2237691  5/1991  United Kingdom .

Primary Examiner—Leo P. Picard
Assistant Examiner—Bot Ledynh
Attorney, Agent, or Firm—Perman & Green

[57] ABSTRACT

A circuit assembly comprises a plurality of electronic devices mounted on a circuit board, including a matched pair of devices intended for use together in the same circuit. In order to reduce the risk of using unmatched devices at the assembly stage the pair of matched devices are joined together prior to mounting them on the circuit board. For this purpose a simple bracket is disclosed into which the two devices can be inserted from opposite ends by push-fitting.

7 Claims, 2 Drawing Sheets

CIRCUIT ASSEMBLY

This invention relates to a circuit assembly comprising a plurality of electronic devices mounted on a substrate.

BACKGROUND OF THE INVENTION

Crystal filter devices are commonly used as an intermediate frequency (IF) filter for mobile cellular telephone applications. Conventionally crystal filters are commercially available as two pole filters housed in a single package having a standard outline. Where greater attenuation is required four pole filters may be used. Four pole filters can be implemented using a matched pair of two pole filters in combination. In this context "a matched pair" refers to a pair of devices intended for use together in the same circuit.

Traditionally, matched pairs of crystal filter devices are individually mounted by hand onto a printed circuit board. The assembly operative is able to check that the two devices about to be mounted on a particular circuit board are intended to be used as partners.

Although in theory automated assembly is possible special problems arise with matched pairs of devices. For example on an automated assembly line, if the two devices of the matched pair are due to be mounted successively and one of the devices is misaligned, or even missing altogether, the fault is unlikely to be detected until after the other device has been mounted on the circuit board. In this case the circuit board is effectively rendered useless because it is not viable subsequently to locate and individually assemble the missing or mis-aligned device or to provide an alternative device because of the difficulty of matching. Also, if the devices are provided in a continuous sequence, for example on a reel of embossed tape, as is common for devices which are to be placed individually on an automated assembly line, there is a risk that synchronization may be lost whereby one device of a matched pair is assembled in combination with a device from the next matched pair of devices. Once such a loss of synchronization has occurred many circuit assemblies may be manufactured with mis-matched pairs of crystal filters. The cost of omitting or mis-aligning a device placement, or the placement of a mis-matched pair can be very significant indeed.

SUMMARY OF THE DESCRIPTION

According to the present invention there is provided a circuit assembly comprising a substrate for mounting a plurality of electronic devices thereon, and a pair of devices intended for use together mounted on said substrate, said matched pair of devices being co-joined prior to mounting on said substrate.

Since the matched pair of devices are joined together before mounting on the substrate, a circuit assembly in accordance with the invention is eminently suitable for automated assembly. The fact that the two devices of a matched pair are already joined together at the device mounting stage means that it is practically impossible for one device to be mounted on the substrate with anything other than its intended partner. The present invention is thus compatible with very reliable, but low-cost automated assembly.

In accordance with conventional automation procedures the two co-joined devices of a matched pair may be provided sequentially in adjacent locations on an embossed tape or in compartments in a matrix tray. Such techniques are commonly used in the electronics industry for transporting electronic devices into a processing area where they are automatically mounted on a circuit board substrate.

In a particular embodiment the matched pair of electronic devices each comprise a respective housing and the housing of one of the devices of the matched pair is joined to the housing of the other device of the matched pair. Various means of co-joining the devices are envisaged. For example, the respective housings may be fastened together with adhesive. Alternatively the two housings may be enclosed within a common casing or encapsulation. In a preferred embodiment the two devices are held together by a bracket into which the two devices are inserted by push-fitting. The bracket suitably comprises resilient portions which bear against the respective housings of the matched pair of devices to hold the individual devices in place.

The bracket may also comprise means such as an asymmetric arrangement of tabs (preferably integral with the bracket) for determining the orientation of the co-joined device pair. The orientation determining means may be used also to support the bracket on the substrate and furthermore to provide an electrically conductive path to electrical contact means, e.g. at ground potential, on the substrate. To this end the whole bracket may be formed of an electrically conductive material.

BRIEF DESCRIPTION OF THE DRAWINGS

Embodiments of the invention will now be described by way of example, with reference to the accompanying drawings, in which.

DETAILED DESCRIPTION OF THE INVENTION

Figure 1:
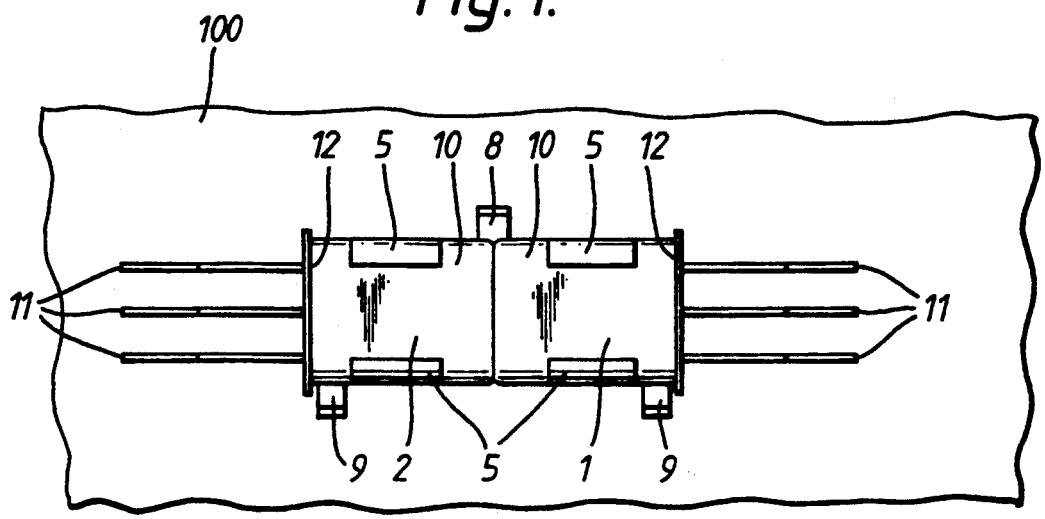
FIG. 1 is a plan view of a matched pair of electronic devices fastened together by a bracket in accordance with the present invention.
Figure 2:
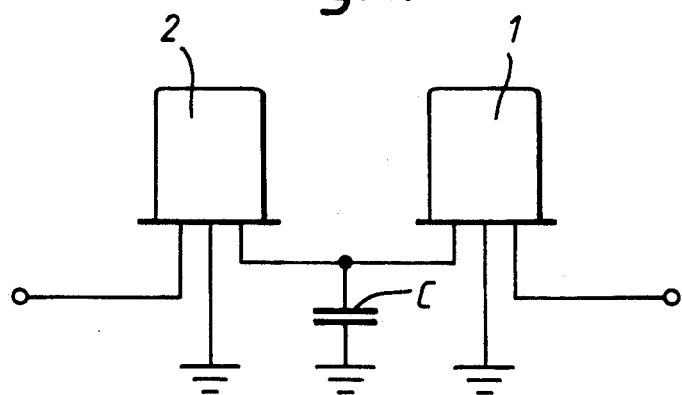
FIG. 2 is a circuit diagram showing the interconnection of a matched pair of electronic devices.

FIG. 1 shows a matched pair of crystal filter devices 1,2 mounted on a portion of a circuit board 100. As is conventional, conductive tracks are present on the circuit board, but for the sake of clarity these are not shown in FIG. 1. The devices 1,2 are joined together in the longitudinal direction with the crystal filter device 2 oriented through 180° relative to its partner device 1. The devices 1 and 2 are thus disposed end-to-end in an anti-parallel in-line configuration. Each of the crystal filter devices is present in a conventional hermetically sealed package comprising an outer metal canister 10 having a standard outline and readily available through normal commercial channels. For example, in mobile telephone applications the crystal filters may be model number 45S20BD available from Nihon Dempa Kogyo (NDK) Co Ltd, 6th Floor, Odaku Nishi Shinjuku Building, 1-47-1, Hatsudai, Shibuya-Ku, Tokyo, Japan. Each of these devices is a two pole device. When coupled using a capacitor C as shown in FIG. 2 the resulting four pole filter has a nominal frequency of 45 MHz, a passband width of ±10 KHz, and an attenuation of 80 dB over an attenuation band width of ±25 kHz. The insertion loss of the combined filter is 3.0 dB.

Three conductive leads 11 extend from one face of the canister 10 of each crystal filter device 1 and 2. The leads, which are bent into a dog-leg configuration to enable surface mounting on a circuit board, are associated respectively with an input, output and ground terminal.

Figure 3:
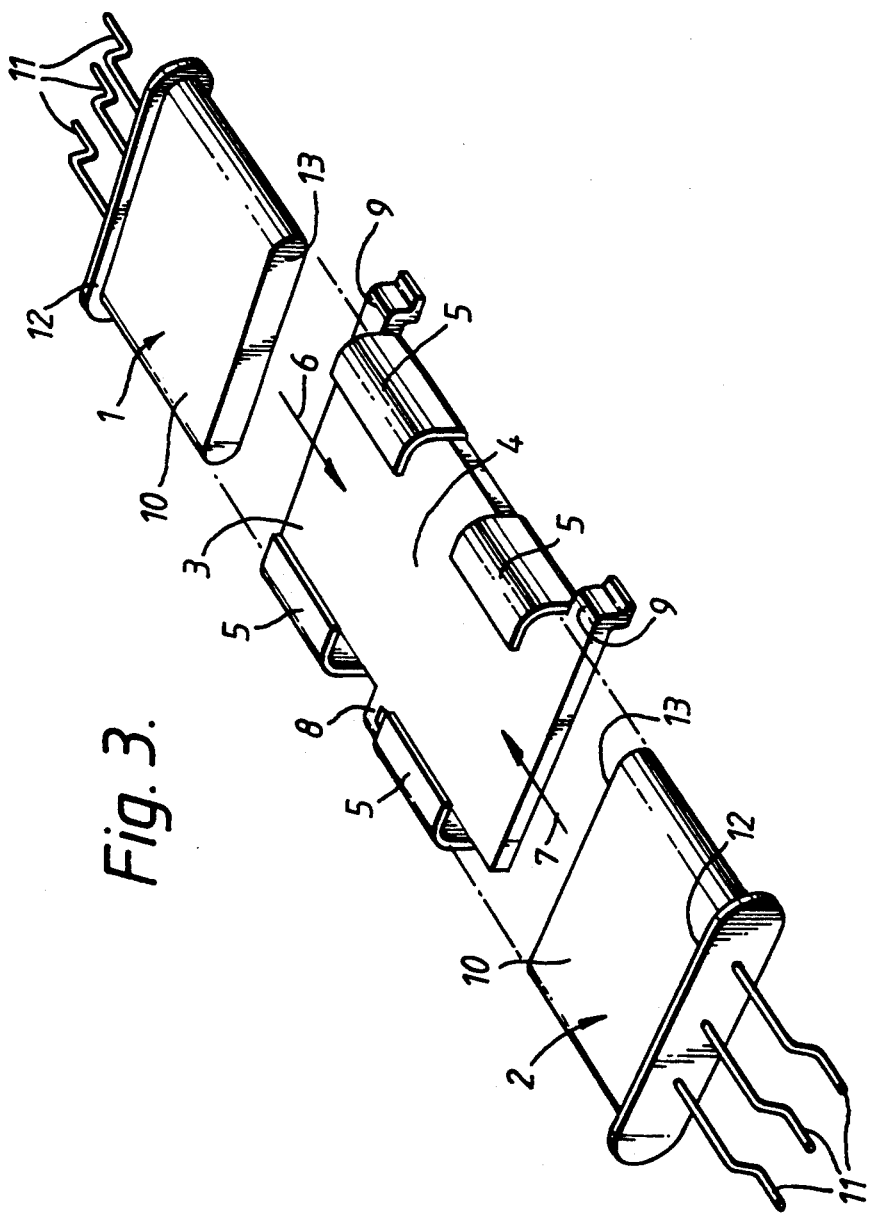
FIG. 3 is a perspective view of the bracket in FIG. 1 showing the electronic devices separated therefrom.

The two filter devices 1 and 2 are held together by means of a one-piece bracket 3 made for example of conductive material, such as tin-plated spring steel. As can be seen most clearly in FIG. 3, the bracket 3 comprises a substantially flat back plate 4 having a generally rectangular outline. Extending integrally from two opposite sides of the back plate 4 are respective pairs of clip-like projections 5 having a generally U-shaped configuration in cross-section. The shape of the clips 5 is complementary to that of the canisters 10. The height of the U-shaped projections 5 is determined by the thickness of the canisters 10 and is chosen appropriately so that the crystal filter devices 1 and 2 can be slidably push-fitted through opposite ends of the bracket 3 as indicated by the arrows 6 and 7 in FIG. 3. The devices 1 and 2 are inserted until the end face 13 of the canister 10 opposite the conductive leads 11 of one device 1 abuts the equivalent end face 13 of the other device 2. The flange 12 adjacent the conductive leads 11 on each canister limits the extent to which each device can be inserted individually into the bracket, i.e. further insertion of either device is prevented when the flange 12 abuts the outer edge of the projections 5 on the bracket 3.

The bracket 3 additionally comprises an integral centrally disposed tab-like projection 8 on one edge of the back plate 4 intermediate the projections 5. Additionally a pair of integral tab-like projections 9 are provided on the opposite edge of the back plate towards the outer ends thereof. The asymmetrical arrangement of the projections 8 and 9 provide a locating feature whereby the orientation of the co-joined device pair 1 and 2 can be determined in an automated assembly process. Specifically the locating tabs 8,9 enable the co-joined device pair to be oriented correctly, e.g. on an embossed tape or in compartments of a matrix tray, for transportation into the processing area prior to assembly of the co-joined devices on a circuit board. Suitably in the processing area the co-joined matched pair of devices are picked up and moved into the assembly position by a conventional automatic device placement/insertion machine, e.g. employing a vacuum suction probe.

In the present embodiment the tabs 8 and 9 are bent into a dog-leg configuration whereby the outer portions of the tabs are co-planar with the outer portions of the conductive leads 11. Thus when the co-joined device pair is mounted on the circuit board 100 the tabs 8 and 9 physically engage the circuit board and hence serve to support the bracket and filter assembly. Also, the tabs 8 and 9 can be used to provide electrical ground connection to appropriate contact areas on the circuit board.

The matched pair of crystal filter devices 1 and 2 may be joined together by alternative means and in different configurations.

Figure 4:
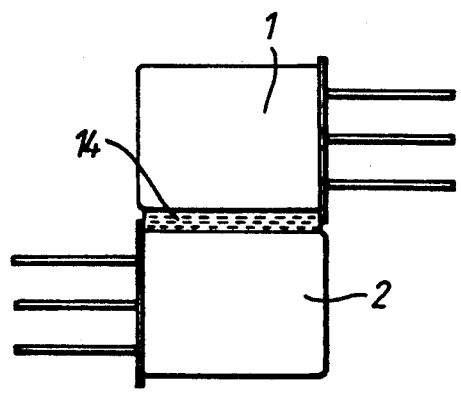
FIG. 4 is a plan view of an alternative arrangement of a matched pair of electronic devices secured together with adhesive.

For example the devices 1 and 2 in FIG. 4 are joined together in side-by-side arrangement, and are fastened together by an adhesive 14.

Figure 5:
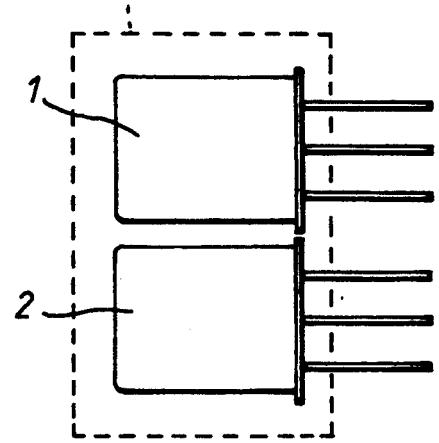
FIG. 5 is a schematic plan view of a further arrangement of a matched pair of electronic devices encapsulated within a common outer package.

As shown schematically in FIG. 5, the devices 1 and 2 are disposed in parallel side-by-side arrangement and are enclosed within a common encapsulation 15 comprising, for example, an insulating or conductive plastics material.

In view of the foregoing description it will be evident to a person skilled in the art that various modifications may be made within the scope of the present invention. In particular the two devices of a matched pair may be joined together prior to placement on a circuit board assembly by any suitable means. Moreover, the devices may be arranged in any suitable orientation or configuration relative to one another, the respective leads of the two devices being arranged to align with appropriately located contact areas on the circuit board. Also, any suitable arrangement of one or more locating features may be used for orienting the co-joined pair of devices.

I claim:
1. A circuit assembly comprising:
   a substrate; and
   a circuit subassembly connected to the substrate, the subassembly comprising:
      a mounting bracket comprised of electrically conductive material and having projections; and
      a matched pair of electronic devices secured to each other by the mounting bracket, the matched pair of devices each having an electrically conductive housing such that the matched pair of devices are electrically connected to the mounting bracket by means of their housings contacting the bracket;
   wherein the projections on the mounting bracket are electrically connected to contact areas on the substrate to electrically connect the matched pair of devices to the substrate through the bracket.
2. A circuit assembly as in claim 1 wherein the bracket is suitably sized and shaped to have the matched pair of devices connected to the bracket by push-fit insertion into predetermined receiving areas of the bracket.
3. A circuit assembly as in claim 1 wherein the bracket comprises resilient portions which bear against the respective housing of the matched pair of devices to hold the matched pair of devices in place in the bracket.
4. A circuit assembly as in claim 1 wherein the bracket includes means for determining orientation of the co-joined matched pair of electronic devices on the substrate to only one orientation.
5. A circuit assembly as in claim 1 wherein the bracket is a one-piece member suitably sized and shaped to receive the matched pair of devices in only one orientation relative to each other.
6. A circuit assembly as in claim 5 wherein the orientation is end-to-end.
7. A circuit assembly as in claim 1 wherein the matched pair of devices comprise a pair of crystal filter devices.

* * * * *